(12) United States Patent
Chang-Chien

(10) Patent No.: US 12,506,101 B2
(45) Date of Patent: Dec. 23, 2025

(54) CHIP STRUCTURE, SEMICONDUCTOR PACKAGE, AND FABRICATING METHOD THEREOF

(71) Applicant: Powertech Technology Inc., Hukou Township, Hsinchu County (TW)

(72) Inventor: Shang-Yu Chang-Chien, Hukou Township, Hsinchu County (TW)

(73) Assignee: Powertech Technology Inc., Hukou (TW)

( * ) Notice: Subject to any disclaimer, the term of this patent is extended or adjusted under 35 U.S.C. 154(b) by 385 days.

(21) Appl. No.: 18/331,150

(22) Filed: Jun. 7, 2023

(65) Prior Publication Data

US 2024/0021558 A1    Jan. 18, 2024

(30) Foreign Application Priority Data

Jul. 15, 2022  (TW) .................. 111126748

(51) Int. Cl.
*H01L 23/48* (2006.01)
*H01L 21/48* (2006.01)
(Continued)

(52) U.S. Cl.
CPC .......... *H01L 24/17* (2013.01); *H01L 21/4853* (2013.01); *H01L 21/561* (2013.01); *H01L 23/3107* (2013.01); *H01L 23/49816* (2013.01); *H01L 24/09* (2013.01); *H01L 24/16* (2013.01); *H01L 24/32* (2013.01); *H01L 24/73* (2013.01); *H01L 24/96* (2013.01); *H01L 25/165* (2013.01); *H01L 2224/09179* (2013.01);
(Continued)

(58) Field of Classification Search
CPC ........... H01L 24/17; H01L 21/4853; H01L 23/49816; H01L 24/09; H01L 24/16; H01L 24/32; H01L 24/73; H01L 24/96; H01L 2224/09179; H01L 2224/16054; H01L 2224/16265; H01L 2224/1703; H01L 2224/17104; H01L 2224/17136; H01L 2224/17179; H01L 2224/32268; H01L 2224/73204; H01L 2224/95001; H01L 2224/96; H01L 2225/10; H01L 2924/384; H01L 25/105; H01L 23/585; H01L 2224/1403; H01L 24/06; H01L 24/11; H01L 23/3128
USPC .......................................................... 257/737
See application file for complete search history.

(56) References Cited

U.S. PATENT DOCUMENTS

2019/0109118 A1\*  4/2019  Yu ........................... H01L 24/96
2020/0357770 A1\*  11/2020  Chiang ................. H01L 23/315

FOREIGN PATENT DOCUMENTS

TW          I751052 B       12/2021

\* cited by examiner

*Primary Examiner* — Theresa T Doan
(74) *Attorney, Agent, or Firm* — patenttm.us

(57) ABSTRACT

A chip structure has a chip body having a plurality of pads, a plurality of metal bumps respectively formed on the pads, and a patterned bump directly formed on the chip body. The patterned bump has at least two different upper and lower plane patterns. A top surface of each of the metal bumps is higher than a height position on which the upper plane pattern is. When the chip structure is ground to the height position, the ground tops of the metal bumps and the upper plane pattern are flush. Therefore, detecting whether the upper plane pattern is exposed determines whether all the metal bumps are exposed and flush to each other to avoid insufficient grinding depth or over-ground.

18 Claims, 16 Drawing Sheets

(51) Int. Cl.
*H01L 21/56* (2006.01)
*H01L 23/00* (2006.01)
*H01L 23/31* (2006.01)
*H01L 23/498* (2006.01)
*H01L 23/52* (2006.01)
*H01L 25/16* (2023.01)

(52) U.S. Cl.
CPC ............... *H01L 2224/16054* (2013.01); *H01L 2224/16055* (2013.01); *H01L 2224/16265* (2013.01); *H01L 2224/1703* (2013.01); *H01L 2224/17104* (2013.01); *H01L 2224/17136* (2013.01); *H01L 2224/17179* (2013.01); *H01L 2224/32225* (2013.01); *H01L 2224/32268* (2013.01); *H01L 2224/73204* (2013.01); *H01L 2224/95001* (2013.01); *H01L 2224/96* (2013.01); *H01L 2225/10* (2013.01); *H01L 2924/384* (2013.01)

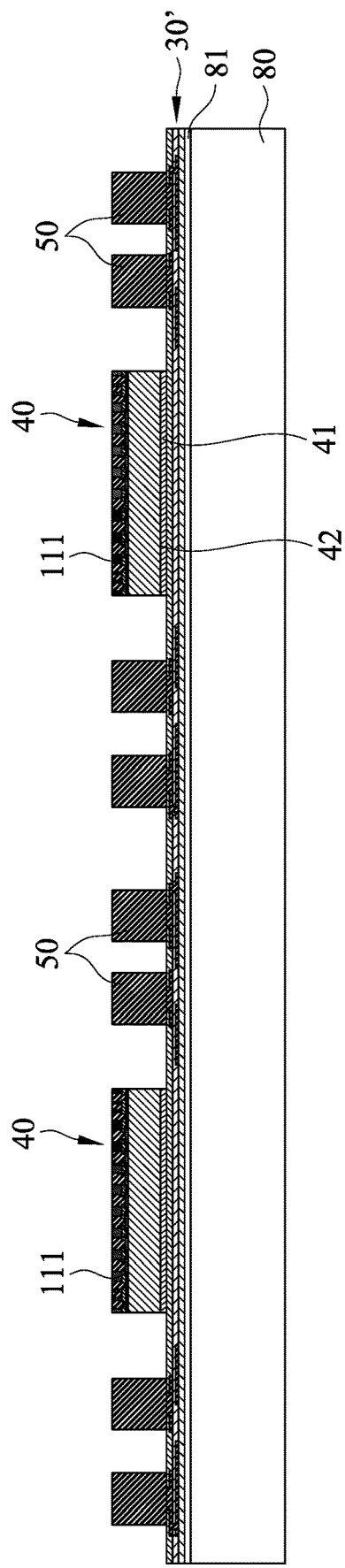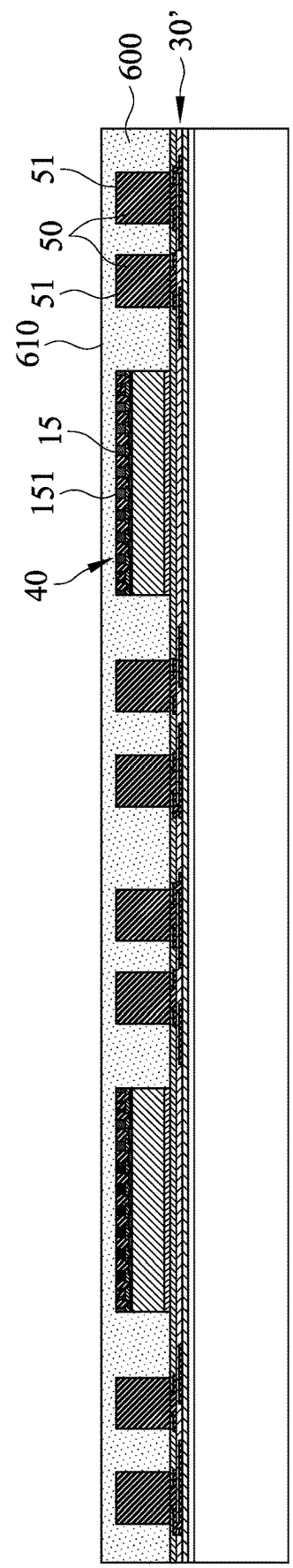
FIG. 9A
FIG. 9B

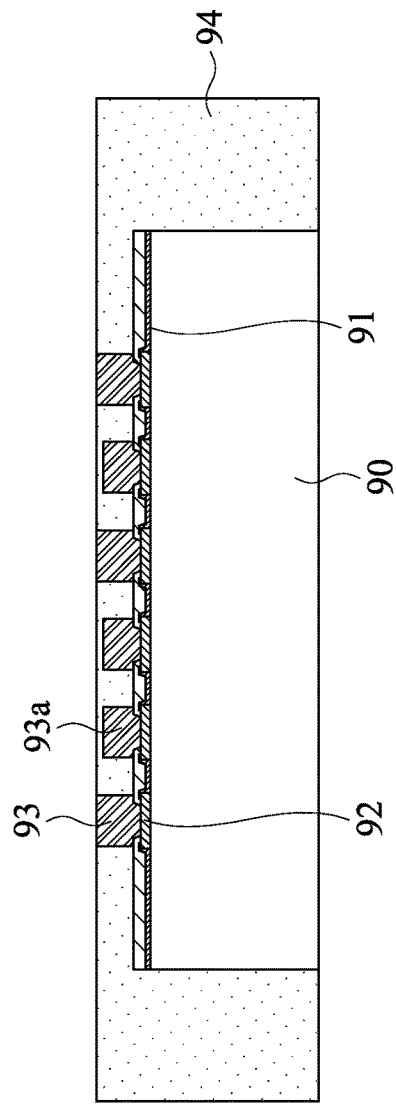
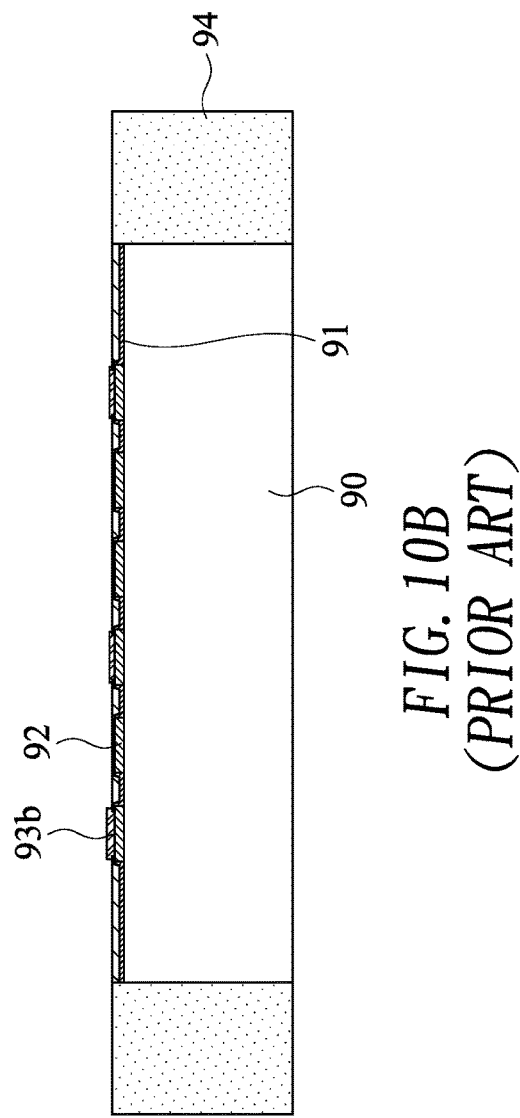
FIG. 10A (PRIOR ART)
FIG. 10B (PRIOR ART)

CHIP STRUCTURE, SEMICONDUCTOR PACKAGE, AND FABRICATING METHOD THEREOF

CROSS-REFERENCE TO RELATED APPLICATIONS

This application is based upon and claims priority under 35 U.S.C. 119 from Taiwan Patent Application No. 111126748 filed on Jul. 15, 2022, which is hereby specifically incorporated herein by this reference thereto.

BACKGROUND OF THE INVENTION

1. Field of the Invention

The present invention is related to a chip structure, a semiconductor package, and a fabricating method thereof.

2. Description of the Prior Arts

With reference to FIG. 10A, in a fabricating method of a chip first type fan-out semiconductor package, a plurality of pads 92 is formed on an active surface 91 of a chip 90, and a plurality of metal bumps 93 is respectively formed on the pads 92. Then, the chip 90 with the pads 92 and the metal bumps 93 is encapsulated by an encapsulant 94. The encapsulant 94 is ground to expose the metal bumps 93 and a step of forming a redistribution layer is proceeded after then.

However, in the grinding step, a depth of grinding of the encapsulant 90 is hard to control. As shown in FIG. 10A, the depth of grinding is insufficient, so some of the metal bumps 93 are exposed from the encapsulant 94 and the rest of the metal bumps 93a are still encapsulated by the encapsulant 94. On the contrary, as shown in FIG. 10B, the depth of grinding is too much, so a part of the metal bumps 93b are over-ground, or even the metal bumps 93 disappear and the pads 92 are damaged.

Therefore, the chip structure and the semiconductor package have to be improved.

SUMMARY OF THE INVENTION

An objective of the present invention is to provide a chip structure, a semiconductor package and fabricating method thereof.

To achieve the objection mentioned above, the chip structure includes:
a chip body having an active surface and a plurality of pads, wherein the active surface includes: and
    a pad area on which the plurality of pads formed on the pad area;
    a pad-free area;
a plurality of metal bumps respectively formed on the corresponding pad on the pad area, and a first top surface of the metal bumps higher than a first height; and
at least one patterned bump formed on the pad-free area, wherein the at least one patterned bump includes:
    a first plane pattern located at the first height;
    a second plane pattern different from the first plane pattern and located at a second height, wherein the second height is smaller than the first height.

With the foregoing description, the main technical feature of the chip structure in accordance with the present invention is forming the at least one patterned bump on the active surface of the chip body. The at least one patterned bump includes two different plane patterns, and the higher first plane pattern is located at the first height. Thus, when the chip structure is ground to the first height, the higher first plane pattern of the at least one patterned bump is flush with the first top surface of the metal bumps after grinding. Therefore, when the chip structure is packaged, detecting whether the first plane pattern is exposed determines whether all the metal bumps are exposed and flush to each other. Thus, when the first plane pattern is exposed, the grinding depth is sufficient to avoid over-ground and improve the yield of the package.

To achieve the objection mentioned above, the semiconductor package includes:
a first wiring layer;
at least one chip structure disposed on the first wiring layer including:
    an active surface facing upwardly and formed with a plurality of metal bumps and at least one patterned bump, wherein the at least one patterned bump has two different plane patterns located at different height, and one of the plane patterns is flush with a top surface of each of the metal bumps;
a plurality of metal pillars formed on and electrically connecting to the first wiring layer having a third top surface;
an encapsulant formed on the first wiring layer and encapsulating the at least one chip structure and the metal pillars, wherein an upper surface of the encapsulant is flush with the first top surface of each of the metal bumps of the at least one chip structure, one of the plane patterns of the at least one patterned bump, and the third top surface of each of the metal pillars to form a plane; and
a second wiring layer formed on the plane to electrically connect to the metal bumps of the at least one chip structure and the metal pillars and electrically insulated with the at least one patterned bump.

With the foregoing description, the main technical feature of the semiconductor package in accordance with the present invention is packaging a chip structure having the patterned bump. One of the plane patterns of the patterned bump is flush with the first top surface of the metal bumps. During a grinding step of a semiconductor package process, detecting whether the plane pattern is exposed determines whether all the metal bumps are exposed and flush to each other. Thus, when the first plane pattern is exposed, the second top surface of the metal pillars to form a plane. The grinding depth is sufficient to avoid over-ground and the yield of the second wiring layer formed on the plane may be ensured.

To achieve the objection as mentioned above, the fabricating method of the semiconductor package includes steps of:
(a) providing a carrier and forming a first wiring layer on the carrier;
(b) forming a plurality of metal pillars on the first wiring layer, wherein each of the metal pillars has a third top surface, and the metal pillars electrically connect to the first wiring layer;
(c) disposing a plurality of chip structures in the first wiring layer, wherein each of the chip structures includes an active surface facing upwardly, the active surface includes a plurality of metal bumps and at least one patterned bump, the at least one patterned bump has two different plane patterns, and one of the plane patterns is flush with a first top surface of each of the metal bumps;

(d) forming an encapsulant on the first wiring layer to encapsulate the metal pillars and the chip structures;

(e) grinding an upper surface of the encapsulant until the upper surface of the encapsulant to flush with the first top surface of each of the metal bumps of the chip structure, one of the plane patterns of the at least one patterned bump, and the third top surface of the metal pillars to form a plane;

(f) forming a second wiring layer on the plane of the encapsulant and electrically connecting to the metal pillars and the metal bumps of the chip structures, and the second wiring layer electrically insulated with the patterned bumps;

(g) removing the carrier to expose a fourth bottom surface of the first wiring layer; and (h) processing a cutting step to separate each of the semiconductor packages.

With the foregoing description, the main technical feature of the fabrication method of the semiconductor package in accordance with the present invention is forming the encapsulant on the first wiring layer to encapsulate the metal pillars and the chip structures having at least one patterned bump. Due to one of the plane patterns of the patterned bump is flush with the first top surface of the metal bumps on the same chip structure. In the grinding step of the encapsulant, detecting whether the plane pattern is exposed determines whether all the metal bumps are exposed and flush to each other and the second top surface of the metal pillars to form a plane. The yield of the second wiring layer formed on the plane may be ensured.

BRIEF DESCRIPTION OF THE DRAWINGS

FIGS. 9A to 9E are side views in partial section of different steps in a manufacturing method of the semiconductor in accordance with the present invention; and FIGS. 10A and 10B are side views in partial section of a semiconductor package in accordance with the prior arts.

DETAILED DESCRIPTION OF THE EMBODIMENTS

With multiple embodiments and drawings thereof, the features of the present invention are described in detail as follows.

Figure 1A:
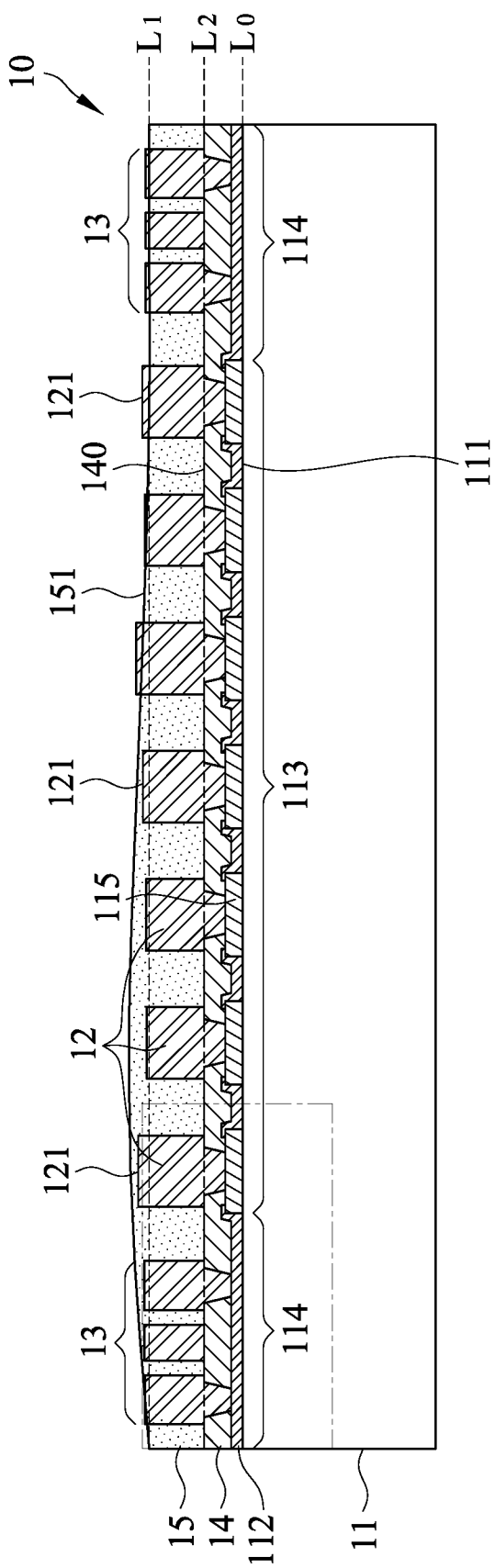
FIG. 1A is a side view in partial section of a first embodiment of a chip structure in accordance with the present invention.

With reference to FIG. 1A, a first embodiment of the chip structure 10 in accordance with the present invention has a chip body 11, a plurality of metal bumps 12, and at least one patterned bump 13.

Figure 1B:
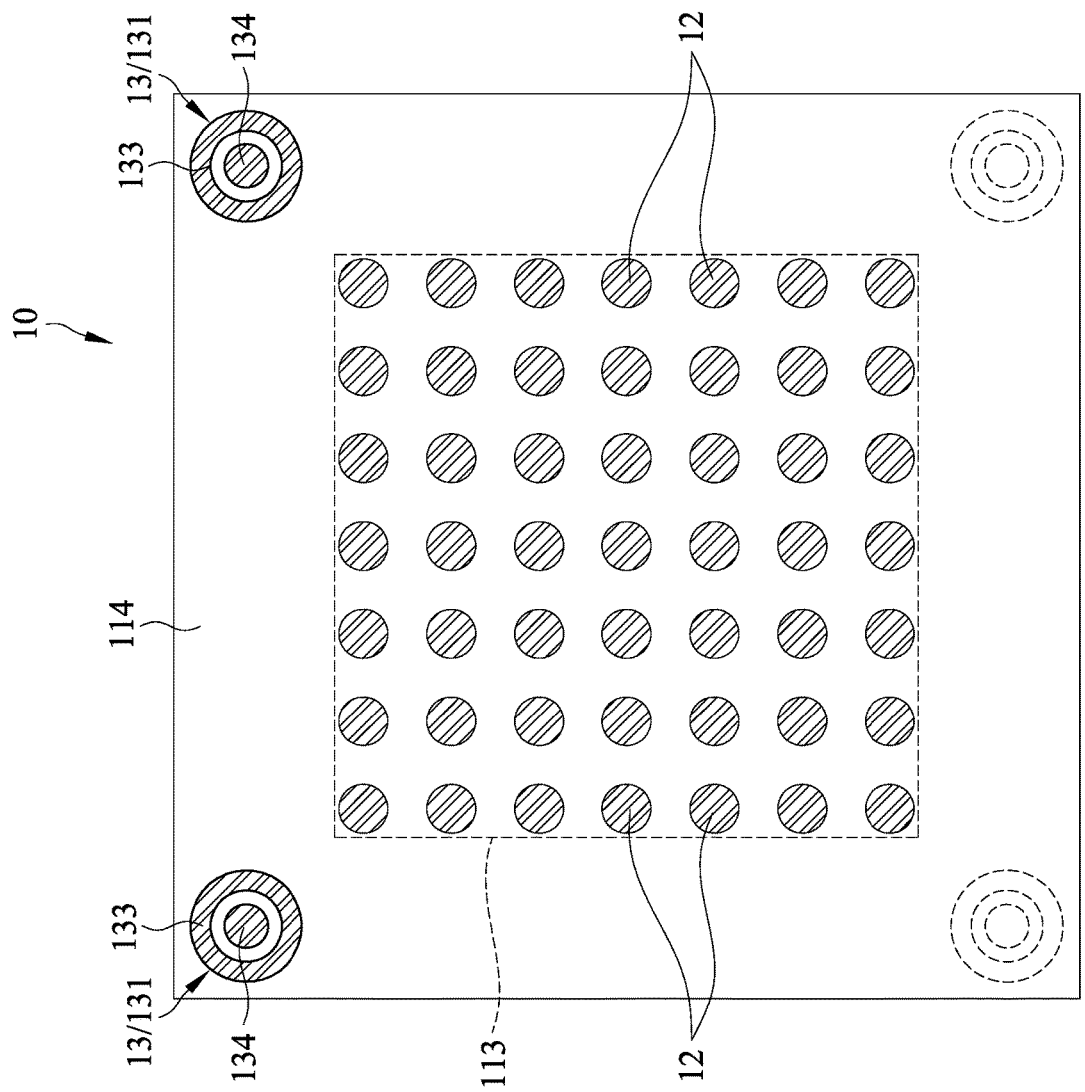
FIG. 1B is a side view in partial section of a chip structure at a first height in FIG. 1A.

As shown in FIG. 1A, the chip body 11 has an active surface 111. The active surface 111 has a pad area 113 and a pad-free area 114. A plurality of pads 115 are formed in the pad area 113. The metal bumps 12 are respectively formed one the pads 115. The at least one patterned bump 13 formed in the pad-free area 114 on the active surface 111. The at least one patterned bump 13 has two plane patterns at different heights. In particular, when all first top surfaces 121 of the metal bumps 12 are higher than a first height L1, a first plane pattern 131 of each patterned bump 13 is located at the first height L1 as shown in FIG. 2B, and a second plane pattern 132 of each of the patterned bump 13 is located at a second height L2 as shown in FIG. 2C. The second height L2 is smaller than the first height L1 (taking one of the planes of the chip body 11 as the common reference height L0). In the present embodiment, as shown in FIG. 1B, the pad-free area 114 may surround the pad area 113, but is not limited thereto.

Figure 2A:
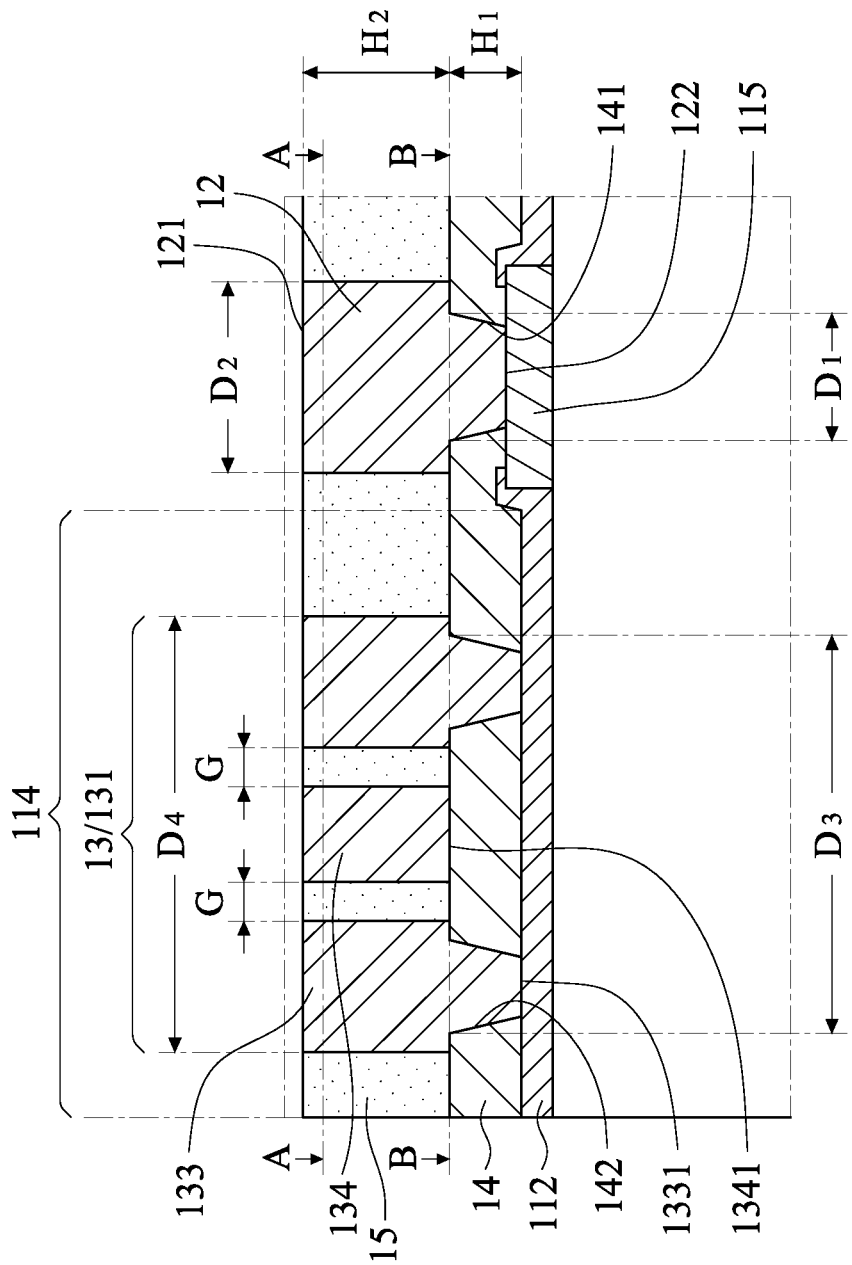
FIG. 2A is an enlarged view of the chip structure in FIG. 1A.
Figure 2C:
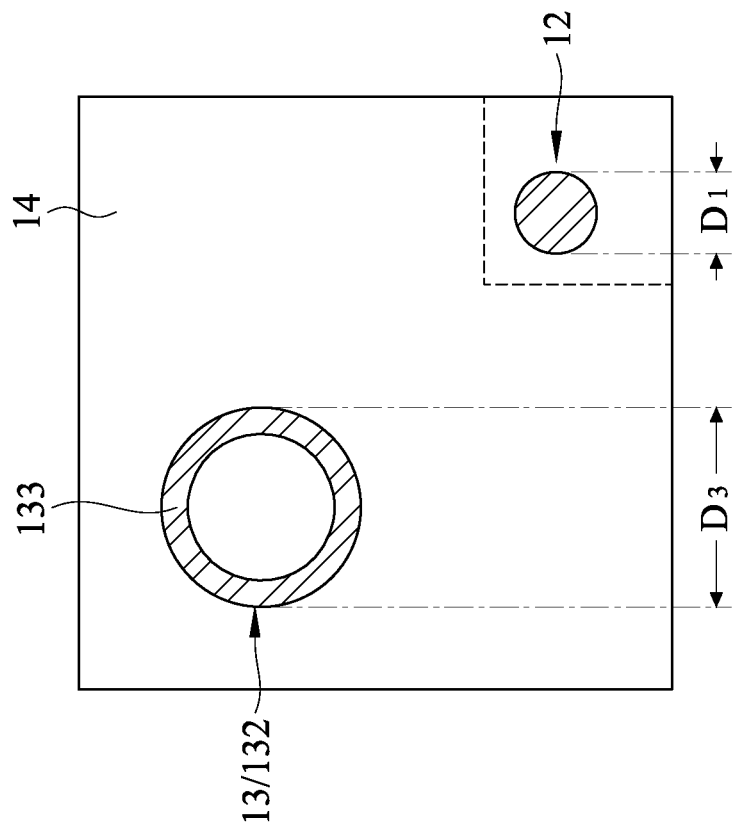
FIG. 2C is a cross-sectional view along the B-B line in FIG. 2A.
Figure 2B:
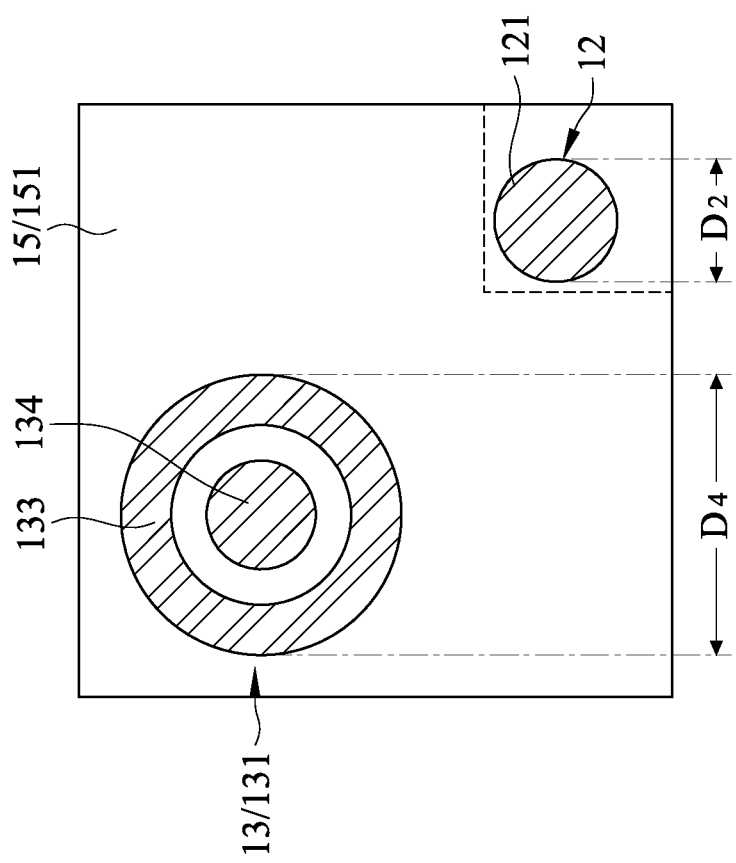
FIG. 2B is a cross-sectional view along the A-A line in FIG. 2A.

With reference to FIGS. 1A and 2A, in the present embodiment, the chip structure 10 further has a first dielectric layer 14. The first dielectric layer 14 is formed on the active surface 111 of the chip body 11 and has a second top surface 140, a plurality of first openings 141, and at least one second opening 142. In the present embodiment, the second top surface 140 is located at the second height L2. The first openings 141 respectively correspond to the pads 115 and are formed through the first dielectric layer 14. The first openings respectively match the metal bumps 12. The at least one second opening 142 corresponds to the pad-free area 114 and is formed through the first dielectric layer 14. The at least one second opening matches the at least one patterned bump 13. In the present embodiment, the at least one second opening 142 is an annular opening, but is not limited thereto. A material of the first dielectric layer 14 may be polyimide (PI), polybenzoxazole (PBO) or the like, and the first dielectric layer 14 may be transparent or translucent. As shown in FIG. 2A, a height range H1 of the first dielectric layer 14 is 3 μm to 7 μm. In one embodiment, a passivation layer 112 may be further formed between the active surface 111 of the chip body 11 and the first dielectric layer 14.

With reference to FIG. 1A, in the present embodiment, the chip structure 10 further has a second dielectric layer 15. The second dielectric layer 15 is formed on the second top surface 140 of the first dielectric layer 14 for encapsulating the metal bumps 12 and the at least one patterned bump 13. The second dielectric layer 15 has a third top surface 151. As shown in FIG. 1A, the third top surface 151 of the second dielectric layer 15 is higher than the first height L1. In the present embodiment, a material of the second dielectric layer 15 may be PI, PBO, or the like. In the present embodiment, the second dielectric layer 15 may be transparent or translucent like which the first dielectric layer 14 is. A height range H2 of the second dielectric layer 15 is 10 µm to 20 µm. In the present embodiment, a Young's modulus of the first dielectric layer 14 is larger than a Young's modulus of the second dielectric layer 15. Thus, the first dielectric layer 14 is harder than the second dielectric layer 15. Therefore, the first dielectric layer 14 may protect the brittle passivation layer 112 formed on the active surface 111, and more importantly protects a plurality of low-k passivation layers (not shown in figures) formed under the pads 115. Furthermore, plural inner passivation layers (not shown in figures) are formed before forming the passivation layer 112 in a wafer foundry process.

With reference to FIGS. 1A and 2A, the metal bumps 12 are respectively formed on the pads 115 in the pad area 113. Each of the metal bumps 12 has a first bottom surface 122. In the present embodiment, the first bottom surface 122 of each of the metal bumps 12 is formed through the corresponding first openings 141 and formed on the corresponding pad 115. In the present embodiment, a diameter of a part of each of the metal bumps 12 in the first openings 141 is smaller than a diameter of a part of each of the metal bumps 12 in the second dielectric layer 15. Thus, as shown in FIG. 2A, a first diameter D1 of a top part of each of the metal bumps 12 in the first openings 141 is smaller than a second diameter D2 of a part of each of the metal bumps 12 in the second dielectric layer 15. In the present embodiment, each of the metal bumps 12 is a solid metal pillar.

With reference to FIG. 1A, the at least one patterned bump 13 is formed on the pad-free area 114. The first top surface 121 of the metal bumps 12, the first plane pattern 131 of each of the patterned bump 13 and the third top surface 151 of the second dielectric layer 15 are higher than the first height L1. After the chip structure is ground to a position at the first height L1 or a position lower than the first height L1 but higher than the second height L2, as shown in FIGS. 2A and 2B, the first plane pattern 131 of the patterned bump 13 is flush with the first top surface 121 of the metal bumps 12 and the third top surface 151 of the second dielectric layer 15. In one embodiment, four patterned bumps 13 are respectively formed on four corners of the pad-free area 114 of the chip body 11. In the present embodiment, two patterned bumps 13 are respectively formed on two adjacent or opposite corners of the pad-free area, but the amount, the relative position, and the arrangement of the patterned bumps 13 are not limited thereto.

Figure 3A:
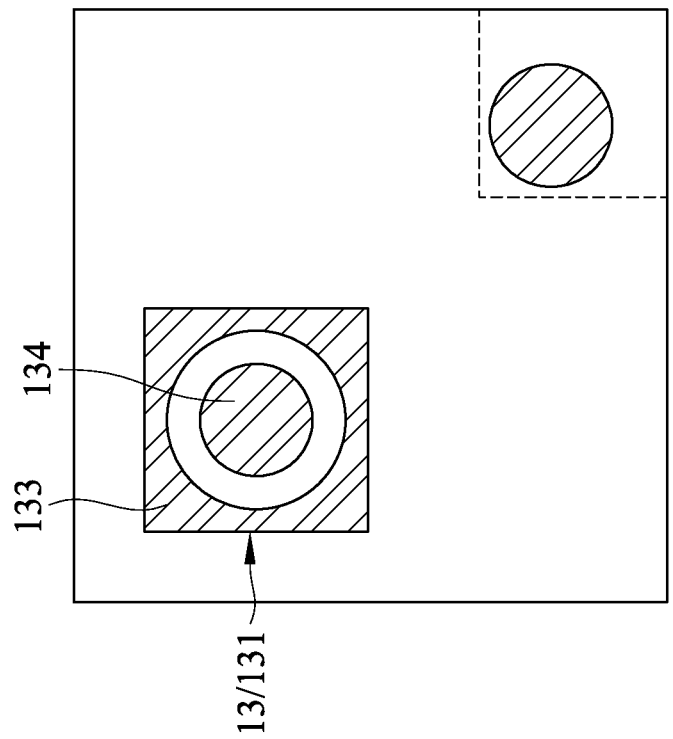
FIG. 3A is an enlarged side view in partial section of a second embodiment of the chip structure in accordance with the present invention.
Figure 3B:
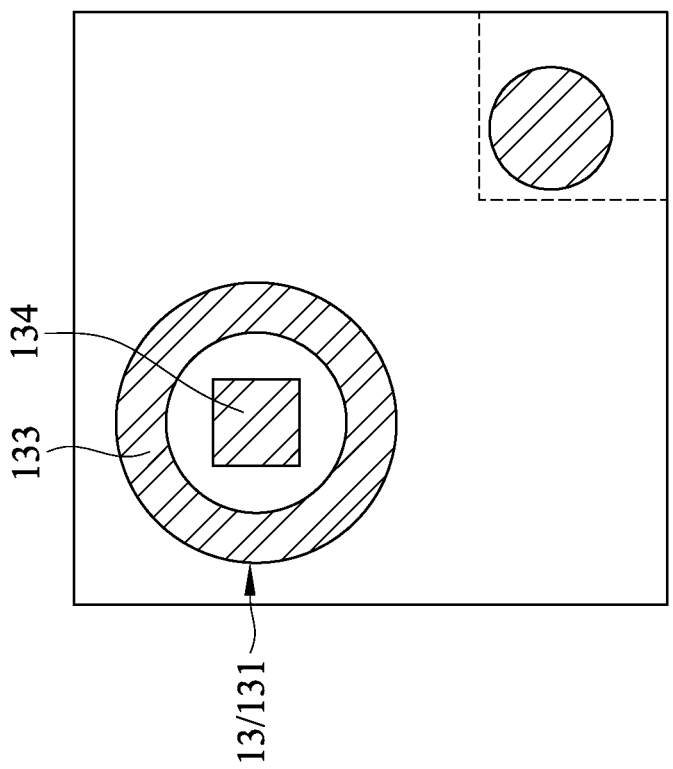
FIG. 3B is an enlarged side view in partial section of a third embodiment of the chip structure in accordance with the present invention.

A structure of the at least one patterned bump 13 is further described as the following. With reference to FIG. 2A, the patterned bumps 13 have an outer hollow metal pillar 133 and an inner solid metal pillar 134. A second bottom surface 1331 of the outer hollow metal pillar 133 is formed through the corresponding second opening 142 of the first dielectric layer 14. Thus, the second bottom surface 1331 of the outer hollow metal pillar 133 is formed on the active surface 111. In the present embodiment, the second bottom surface 1331 is formed on the passivation layer 112. A third bottom surface 1341 of the inner solid metal pillar 134 is formed through the corresponding outer hollow metal pillar 133. Thus, the third bottom surface 1341 of the inner solid metal pillar 134 is formed on the first dielectric layer 14. A gap G is kept between the outer hollow metal pillar 133 and the inner solid metal pillar 134. The gap G is filled by the second dielectric layer 15. Thus, the inner solid metal pillar 134 does not exist in the height range H1 of the first dielectric layer 14. After grinding, the first plane pattern 131 of the patterned bump 13 is presented in the height range H2 of the second dielectric layer 15. Thus, a horizontal view of the outer hollow metal pillar 133 and the inner solid metal pillar 134 located at the first height L1 constitute the first plane pattern 131. In the present embodiment, a diameter of a part of each of the outer hollow metal pillar 133 in the at least one second opening 142 is smaller than a part of each of the outer hollow metal pillar 133 in the second dielectric layer 15. Thus, a third diameter D3 of a top part of the outer hollow metal pillar 133 in the at least one second opening 142 is smaller than a fourth diameter D4 of the part of the outer hollow metal pillar 133 in the second dielectric layer 15. In the present embodiment, as shown in FIG. 2B, the outer hollow metal pillar 133 is a hollow cylinder, so the second opening 142 is presented as an "O" shape in FIG. 2A. In the present embodiment, as shown in FIG. 2B, the first plane pattern 131 is presented as a concentric circle pattern. The second plane pattern 132 of the patterned bumps 13 is presented in the height range H1 of the first dielectric layer 14 (i.e., a height which is not higher than the second height L2 as shown in FIG. 1A). Thus, another horizontal sectional view of the outer hollow metal pillar 133 located at the second height L2 constitutes the second plane pattern 132. As shown in FIG. 2C, the second plane pattern 132 is presented as a single hollow circle pattern. In another embodiment, the inner solid metal pillar 134 may be a solid corner cylinder, as shown in FIG. 3A, the first plane pattern 131 is presented as a pattern in a circle outside and a square inside, and the second plane pattern is presented as a single hollow circle pattern. In another embodiment, the outer hollow metal pillar 133 may be a hollow corner cylinder, as shown in FIG. 3B, the first plane pattern 131 is presented as a pattern in a square outside and a circle inside, and the second plane pattern is presented as a single hollow square pattern. The first plane pattern 131 also may be presented as a concentric quadrilateral pattern. Thus, a combination of the shape of the outer hollow metal pillar 133 and the inner solid metal pillar 134 of the at least one patterned bump 13 may be matched arbitrarily, the shape of the at least one patterned bump 13 is not limited in the concentric cylinder or the concentric corner cylinder.

Figure 4A:
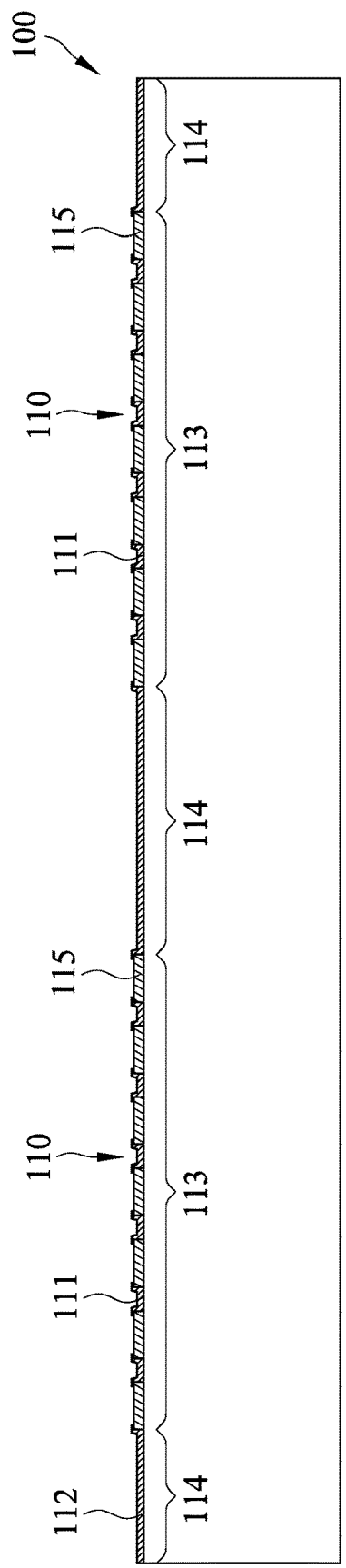
FIGS. 4A to 4E are side views in partial section of different steps in a manufacturing method of the chip structure in accordance with the present invention.

The chip structure in accordance with the present invention is introduced as described above. The fabricating method of the chip structure in accordance with the present invention is further introduced as below. With reference to FIGS. 4A and 4E, the fabricating method of the first embodiment of the chip structure in accordance with the present invention includes steps (a) to (c).

In the step (a), as shown in FIG. 4A, a wafer 100 is provided. The wafer 100 includes a plurality of chip body regions 110, and each of the chip body regions 110 has an active surface 111 facing upwardly. The active surface 111 comprises a pad area 113 and pad-free area 114, and a plurality of pads 115 is formed on the pad area 113.

Figure 4B:
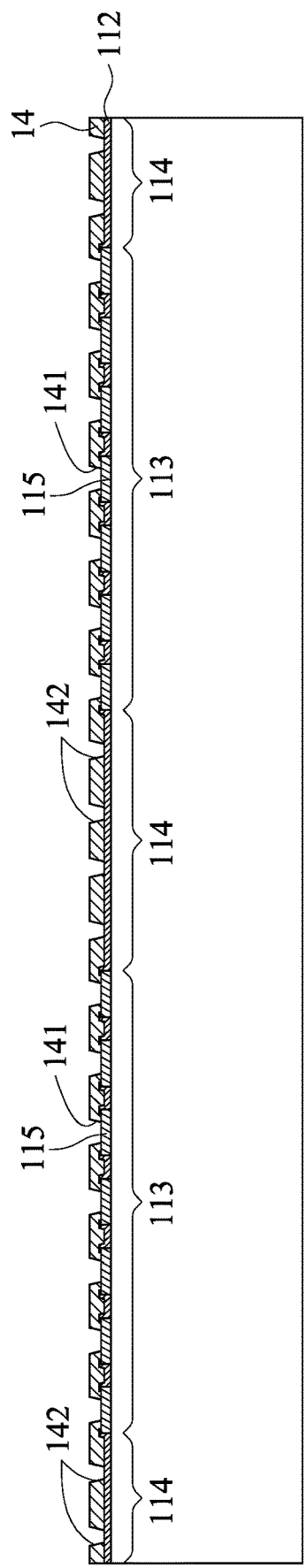
Figure 4C:
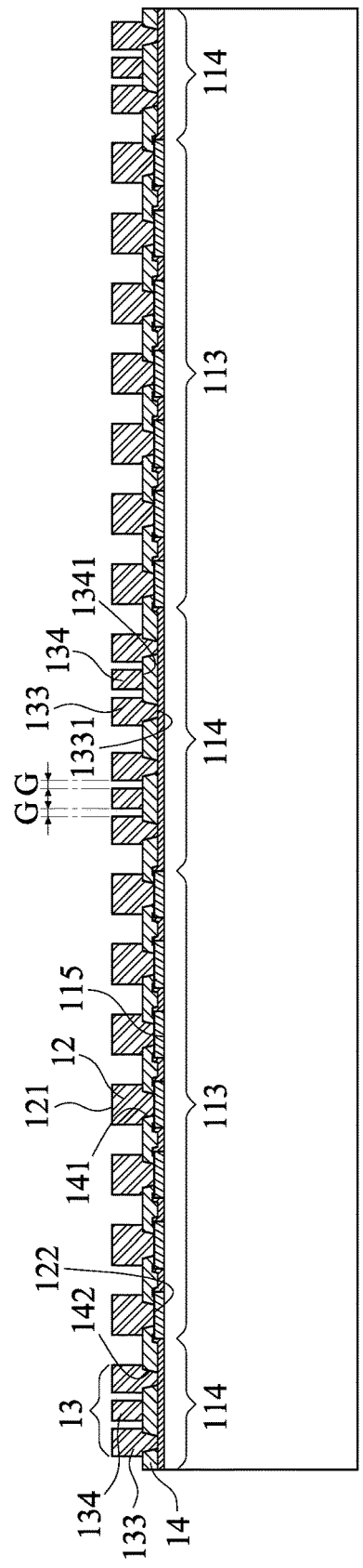

In the step (b), as shown in FIGS. 4B and 4C, a metal bump 12 is formed on each of the pads 115 on the pad area 113, and a plurality of patterned bumps 13 is formed on the pad-free area 114. The patterned bumps 13 has a first plane pattern 131 and a second plane pattern 132 different from the first plane pattern 131 in different heights. With reference to the FIGS. 1A and 2B, a top surface 121 of the metal bumps 12 is higher than a first height L1. The first plane pattern 131 of each of the patterned bumps 13 is located at the first height L1. As shown in FIGS. 1A and 2C, the second plane pattern 132 is located at a second height L2. The second height L2 is smaller than the first height L1. The step (b) further includes steps (b1) to (b3) and may further include a step (b4). The steps (b1) to (b4) correspond to FIG. 4B to 4E.

In the step (b1), as shown in FIG. 4B, a first dielectric layer 14 is formed on the active surface 111 of the chip body 11. A plurality of first openings 141 is formed through the first dielectric layer 14 respectively corresponding to the pads 115. Each of the first openings 141 matches the corresponding metal bump 12. A plurality of second openings 142 is formed through the first dielectric layer 14 corresponding to the pad-free area 114. In the present embodiment, as shown in FIG. 1A, a second top surface 140 of the first dielectric layer 14 is located at the second height L2, and the first dielectric layer 14 may be transparent or translucent. In one embodiment, a passivation layer 112 may be formed on the active surface 111 of each of the chip body regions 110 before forming the first dielectric layer 14.

In the step (b2), as shown in FIG. 4C, the metal bumps 12 are formed on the pad 115 exposed from the corresponding first openings 141. The patterned bumps 13 are formed on the pad-free area 114. An outer hollow metal pillar 133 of each of the patterned bumps 13 is formed on the active surface 111. In the present embodiment, each of the outer hollow metal pillars 133 is formed in the corresponding second openings 142 of the first dielectric layer 14 formed on the active surface 111. In the present embodiment, each of the outer hollow metal pillars 133 may be formed on the passivation layer 112. An inner solid metal pillar 134 of each of the patterned bump 13 is formed on the second top surface 140 of the first dielectric layer 14 inside the corresponding outer hollow metal pillar 133. A gap G is kept between the outer hollow metal pillar 133 and the inner solid metal pillar 134. As shown in FIG. 1A, a first top surface 121, a top surface of the outer hollow metal pillar 133, and a top surface of the inner solid metal pillar 134 is higher than the first height L1. As shown in FIG. 2B, the outer hollow metal pillar 133 and the inner solid metal pillar 134 of each of the patterned bumps located at the first height L1 form the first plane pattern 131. As shown in FIG. 2C, the outer hollow metal pillar 133 forms the second plane pattern 132. In the present embodiment, the outer hollow metal pillar 133 may be a hollow cylinder or a hollow corner cylinder, and the inner solid metal pillar 134 may be a solid cylinder or a solid corner cylinder.

Figure 4D:
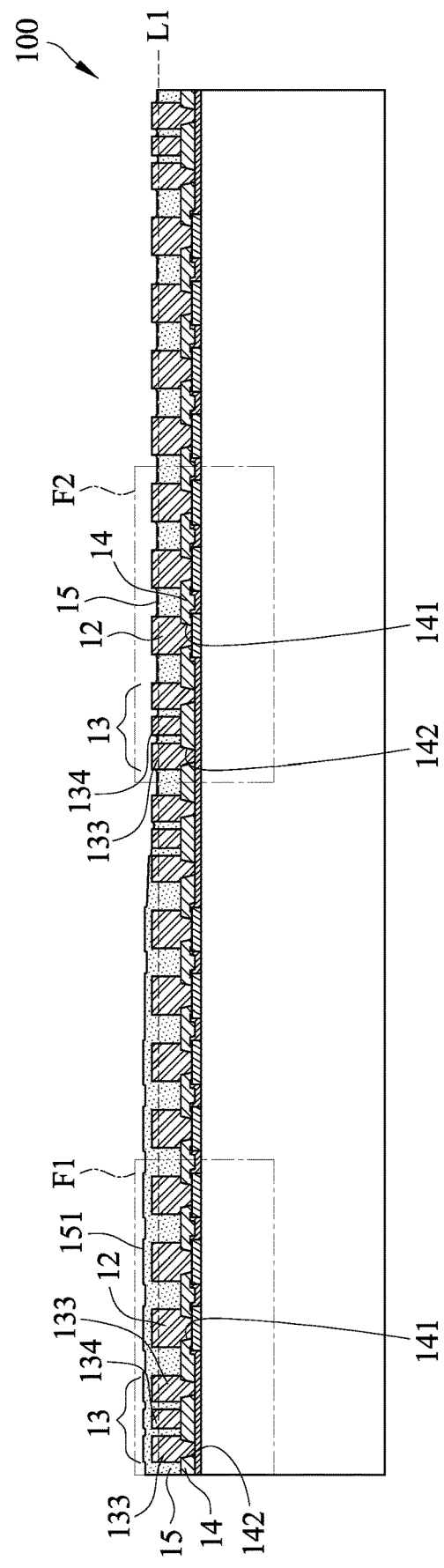
Figure 4E:
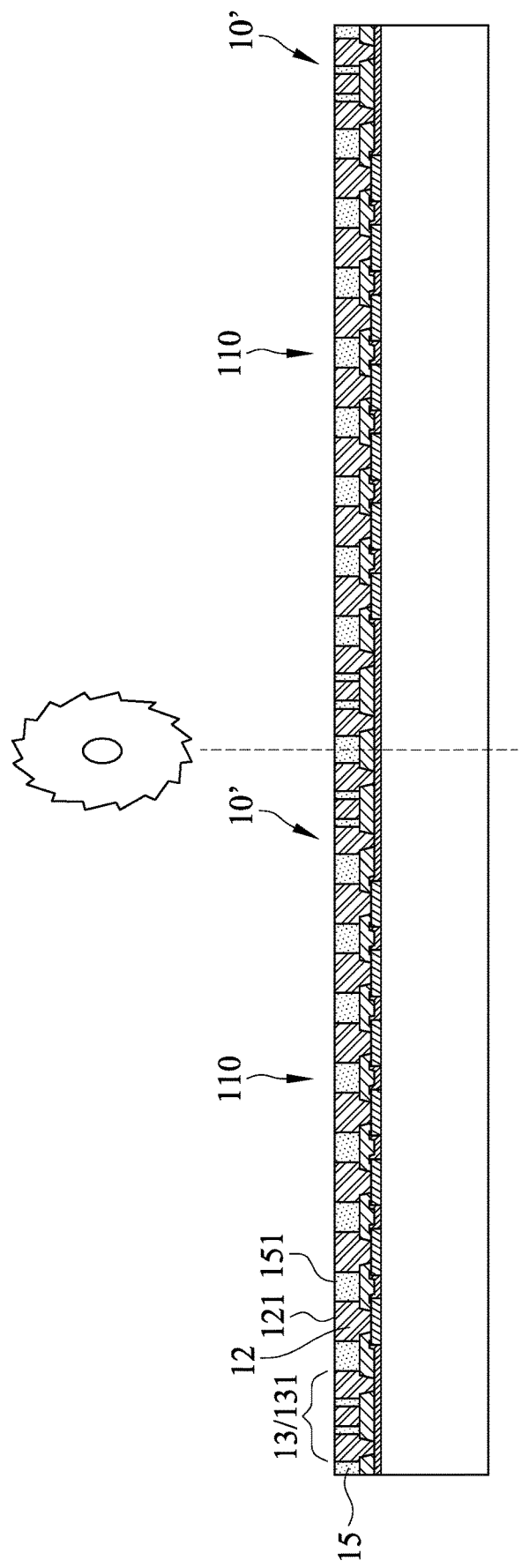
Figure 5B:
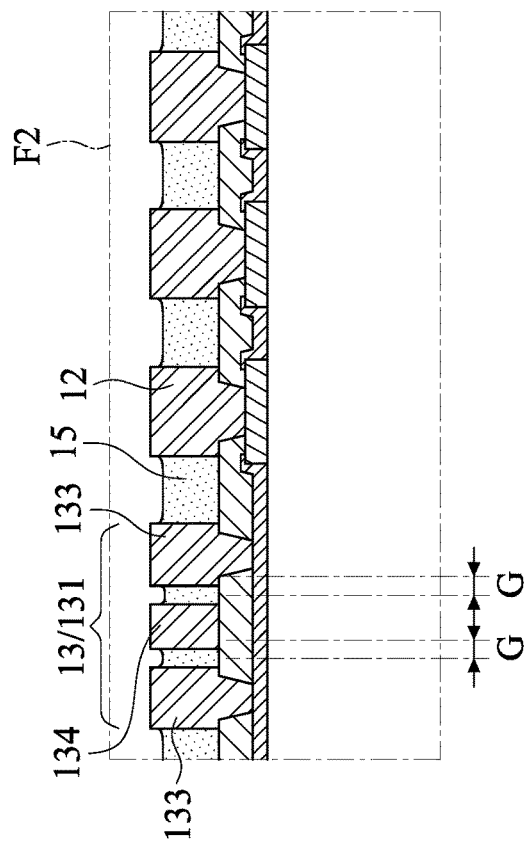
FIG. 5B is an enlarged view of a part of the area F2 in FIG. 4D.
Figure 5A:
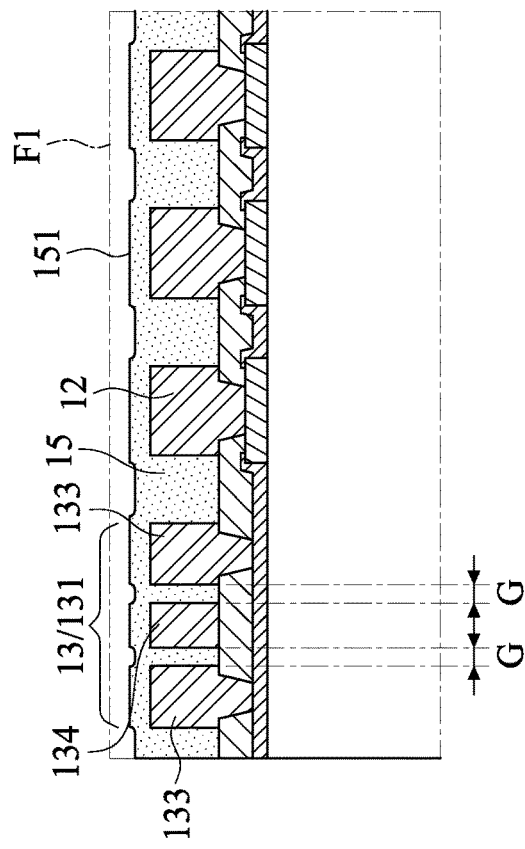
FIG. 5A is an enlarged view of a part of the area F1 in FIG. 4D.

In the step (b3), as shown in FIG. 4D, a second dielectric layer 15 is formed on the first dielectric layer 14. As shown in the F1 area in FIG. 4D and FIG. 5A, the second dielectric layer 15 may encapsulate the metal bumps 12 and the patterned bumps 13 therein. On the contrary, as shown in the F2 area in FIG. 4D and FIG. 5B, the second dielectric layer 15 may cover a side of the metal bumps 12, and a side of the outer hollow metal pillar 133 and a side of the inner solid metal pillar 134 of the patterned bumps 13. As shown in FIG. 1A, a third top surface 151 of the second dielectric layer 15 is higher than the first height L1. The second dielectric layer 15 is filled in the gap G kept between the outer hollow metal pillar 133 and the inner solid metal pillar 134. In the present embodiment, the second dielectric layer 15 may be transparent or translucent, and a Young's modulus of the first dielectric layer 14 is larger than a Young's modulus of the second dielectric layer 15.

In the step (b4), as shown in FIG. 4D, the wafer 100 is ground to the first height L1. Thus, as shown in FIG. 4E, the third top surface 151 of the second dielectric layer 15 is flush with the first plane pattern 131 of the patterned bumps 13 and the first top surface 121 of the metal bumps 12. In the present embodiment, as shown in FIG. 4D, a diameter of a part of the metal bumps 12 in the first openings 141 is smaller than a diameter of a part of the metal bumps 12 in the second dielectric layer 15. In the present embodiment, a diameter of a part of each of the outer hollow metal pillar 133 in the second openings 142 is smaller than a diameter of a part of the outer hollow metal pillar 133 in the second dielectric layer 15.

In the step (c), as shown in FIG. 4E, cut adjacent boundaries of the chip body regions 110 to form a plurality of chip structures 10'.

With the above description, during a grinding process of the follow-up packaging process, the chip structure 10 may avoid insufficient depth of grinding and over-ground occurring. With reference to FIG. 2B, when a chip structure 10 is ground to a preset target depth, which means is ground down to the first height L1, the first plane pattern 131 of the patterned bump 13 is flush with the first top surface 121 of the metal bumps 12. Meanwhile, the depth of grinding of the chip structure 10 is determined as sufficient and the grinding may be stopped. With reference to FIG. 1A, when the chip structure 10 is ground to the second height L2, the inner solid metal pillar 134 of the patterned bump 13 disappears. As shown in FIG. 2C, the second plane pattern 132 of the pattern 13 is exposed from the first dielectric layer 14. Thus, detecting whether the second plane pattern 132 is exposed determines whether the chip structure 10 in FIG. 1A is over-ground in the follow-up packaging process. The yield of the chip structure 10 is further improved.

The chip structure and the fabricating method thereof are introduced as described above. A semiconductor package and fabricating method in accordance with the present invention using the above chip structure 10 to package is further introduced as below. The semiconductor package is first introduced as the following.

Figure 6:
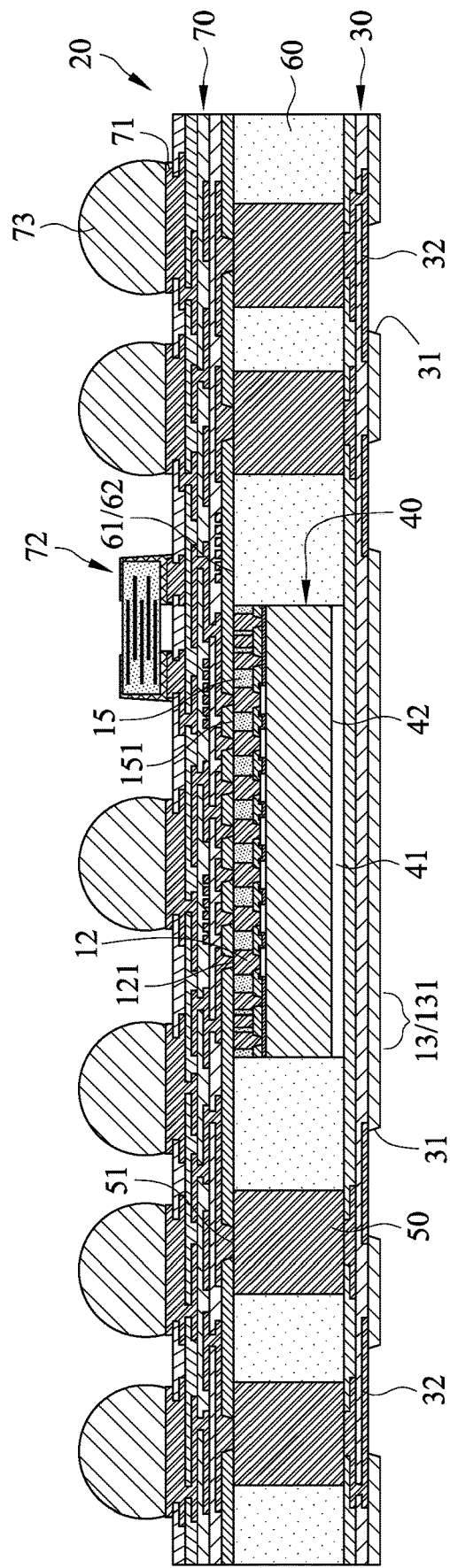
FIG. 6 is a side view in partial section of a first embodiment of a semiconductor package in accordance with the present invention.

With reference to FIG. 6, a first embodiment of a semiconductor package 20 in accordance with the present invention includes a first wiring layer 30, at least one chip 40, a plurality of metal pillars 50, an encapsulant 60, and a second wiring layer 70. The at least one chip 40 is the chip structure 10 introduced above. The at least one chip 40, the metal pillars 50, and the encapsulant 60 are formed on the first wiring layer 30. The second wiring layer 70 is formed on the encapsulant.

The first wiring layer 30 has a plurality of third openings 31 and a metal wire 32. The metal wire 32 is exposed from the third openings 31. In the present embodiment, the first wiring layer 30 is a redistribution layer. In another embodiment, the first wiring layer 30 may be a substrate, but is not limited thereto.

The at least one chip 40 is disposed on the first wiring layer 30 and an active surface 111 of the at least one chip 40 faces upwardly. In the present embodiment, the at least one chip 40 further has an adhesive layer 41 and a rear surface 42. The adhesive layer 41 is disposed between the rear surface 42 of the at least one chip 40 and the first wiring layer 30. In the present embodiment, the semiconductor package 20 includes one chip 40, but the amount of the at least one chip 40 is not limited thereto.

The metal pillars 50 are formed on and electrically connect to the first wiring layer 30. Each of the metal pillars has a fourth top surface 51. The metal pillars 50 surround the at least one chip 40.

The encapsulant 60 is formed on the first wiring layer 30 and encapsulates the at least one chip 40 and metal pillar 50 therein. The encapsulant 60 has an upper surface 61. The upper surface 61 of the encapsulant 60 is flush with the first top surface 121 of each of the metal bumps 12 of the at least one chip 40, the first plane pattern 131 of the at least one patterned bump 13 of the at least one chip 40, the third top surface 151 of the second dielectric layer 15, and the fourth top surface 51 of each of the metal pillars 50 to form a plane 62. Because the second dielectric layer 15 encapsulates among the metal bumps 12 and the at least one patterned bump 13 of the at least one chip 40, the encapsulant 60 does not be filled among the metal bumps 12 and the at least one patterned bump 13. Therefore, compared to encapsulated by the encapsulant 60, the metal bumps 12 and the at least one patterned bump 13 of the at least one chip 40 are encapsulated by the second dielectric layer 15. During a grinding process, spalling or cavities may be formed if the metal bumps 12 and the at least one patterned bump 13 encapsulated by the encapsulant 60 may be avoided. Because of encapsulation of the second dielectric layer 15, the constitution and the flatness of the plane 62 may be ensured. The yield of a redistribution layer formed on the plane 62, especially the yield of a fine wire in the redistribution layer, is improved.

The second wiring layer 70 is formed on the plane 62 to electrically connect to the metal bumps 12 of the at least on chip 40 and the metal pillars 50. Because the patterned bumps 13 are only used for assisting grinding and do not electrically connect to the chip 40, the second wiring layer 70 is electrically insulated with the patterned bumps 13. In the present embodiment, the second wiring layer 70 further has a plurality of metal pads 71. The metal pads 71 are formed on and electrically connect to the second wiring layer 70. In the present embodiment, the second wiring layer 70 is a redistribution layer. In another embodiment, the second wiring layer 70 may be a substrate, but is not limited thereto.

In the present embodiment, the semiconductor package 20 further includes at least one passive device 72 and a plurality of solder balls 73. The at least one passive device 72 electrically connects to the corresponding metal pad 71 of the second wiring layer 70. The at least one passive device 72 is disposed of close to the corresponding chip 40. The solder balls 73 are formed on the corresponding metal pad 71 of the second wiring layer 70. The solder balls 73 surround the corresponding at least one passive device 72. In the present embodiment, the semiconductor package 20 includes a passive device 72 corresponding to the chip 40. The passive device 72 is disposed of as close as possible to the chip 40 to shorten a transmitting path of electric and signals. In the present embodiment, the passive device 72 may be an integrated passive device (IPD) of a multi-layer ceramic capacitor (MLCC), but is not limited thereto.

Figure 7:
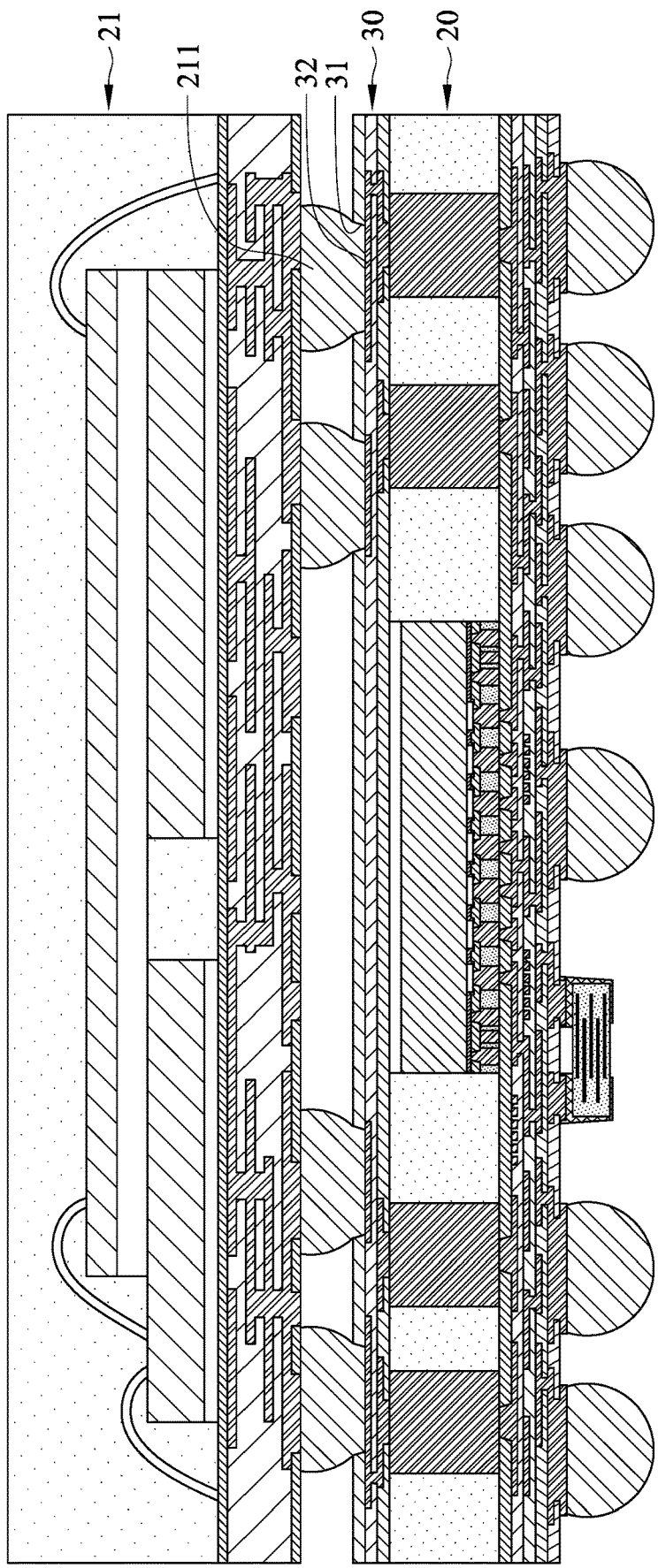
FIG. 7 is a side view in partial section of a second embodiment of the semiconductor package in accordance with the present invention.

With reference to FIG. 7, in a second embodiment in accordance with the present invention, a second semiconductor package 21 is further disposed on the first wiring layer 30 of the semiconductor package 20 of the first embodiment in accordance with the present invention. A plurality of tin balls 211 of the second semiconductor package 21 is disposed through the corresponding third openings 31 of the first wiring layer 30 and electrically connects to the metal wire 32 of the first wiring layer 30 to achieve package on package (PoP).

Figure 8:
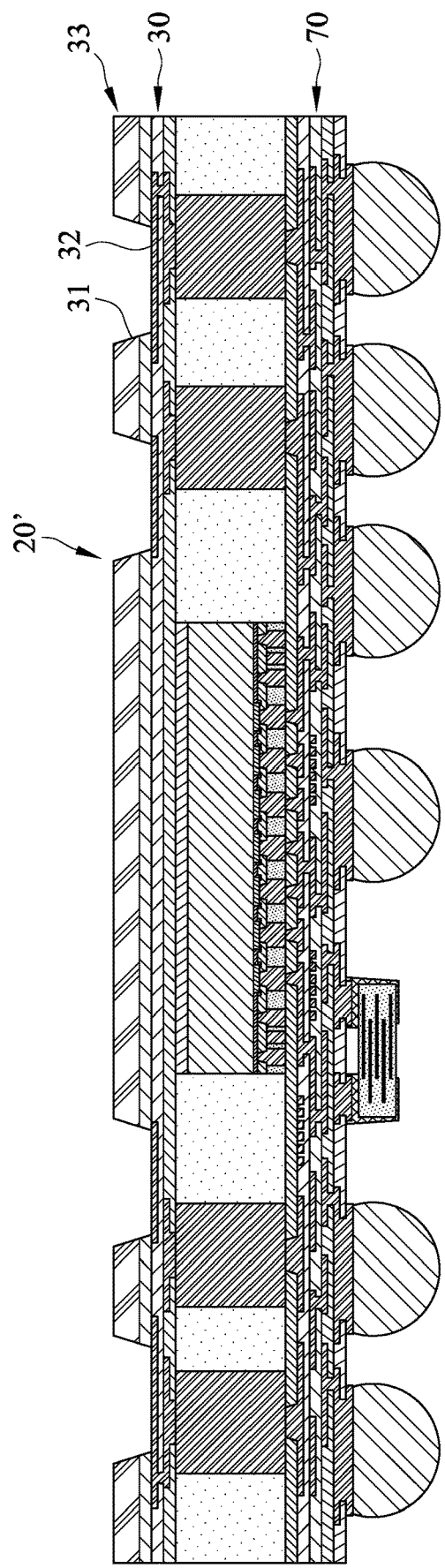
FIG. 8 is a side view in partial section of a third embodiment of the semiconductor package in accordance with the present invention.

With reference to FIG. 8, a third embodiment of the semiconductor package is shown. The semiconductor package 20' in accordance with the third embodiment is similar to the semiconductor package 20 as shown in FIG. 6. In the third embodiment, the first wiring layer 30 further has a warpage control layer 33. The warpage control layer 33 is formed on the first wiring layer 30. The third openings 31 of the first wiring layer 30 are further formed through the warpage control layer 33. A slope of a peripheral wall of a part of the third opening 31 in the first wiring layer 30 is the same as a slope of a peripheral wall of a part of the third opening 31 in the warpage control layer 33. In the present embodiment, because a layer count of the first wiring layer 30 is less than a layer count of the second wiring layer 70, a shrinkage force of the second wiring layer 70 is larger than a shrinkage force of the first wiring layer 30 and the semiconductor package 20' warps downwardly. Therefore, disposing the warpage control layer 33 on the first wiring layer 30 eliminates a difference in the shrinkage force between the first wiring layer 30 and the second wiring layer 70. The warpage control layer 30 eliminates the warpage of the semiconductor package 20' by making the shrinkage force of the first wiring layer 30 and the second wiring layer 70 the same.

In the first embodiment in accordance with the present invention, the encapsulant 60 encapsulates the chip 40 and the metal pillars 50. Detecting whether the first plane pattern 131 of the at least one patterned bump 13 is exposed from the upper surface 61 of the encapsulant 60 ensured that the first top surface 121 of each of the metal bumps 12 and the fourth top surface 51 of each of the metal pillar 50 are completely exposed. Further, the first top surface 121 of each of the metal bumps 12 and the fourth top surface 51 of each of the metal pillars 50 are flush with the third top surface 151 of the second dielectric layer 15 to electrically connect to the second wiring layer 70. Thus, a condition of insufficient depth of grinding or over-ground may be avoided. Furthermore, the first dielectric layer 14 and the second dielectric layer 15 completely cover the active surface 111 of the chip 40. The encapsulant 60 does not encapsulate the metal bumps 12 and the at least one patterned bumps 13. A stress on the encapsulant 60 and the second dielectric layer 15 may be reduced in a follow-up grinding process. The second dielectric layer 15 filled among the metal bumps 12 and the at least one patterned bump 13 does not detach. During the second wiring layer 70 is formed, the plane 62 does not has voids and avoids the device failure caused by metal wire recesses formed in the second circuit layer 70. In the third embodiment in accordance with the present invention, the warpage control layer 33 is further disposed on the first wiring layer 30 to eliminate the warpage due to the difference in the layer count of the first wiring layer 30 and the second wiring layer 70. The yield and reliability of the semiconductor package 20' may be further improved.

The semiconductor package in accordance with the present invention is described above. The fabricating method of the semiconductor package is further described below. With reference to FIGS. 9A to 9E, a first embodiment of the fabricating method of the semiconductor package in accordance with the present invention includes steps (a) to (g).

In the step (a), as shown in FIG. 9A, a carrier 80 is provided, a first wiring layer 30' is formed on the carrier 80. In the present embodiment, an interposed layer 81 is preformed on the carrier 80, then the first wiring layer 30' is formed on interposed layer 81. The interposed layer 80 may be an adhesive layer or a release layer.

In the step (b), as shown in FIG. 9A, a plurality of metal pillars 50 is formed on and electrically connects to the first wiring layer 30'. A plurality of chips 40 which is the chip structure 10 described above is disposed on the first wiring layer 30'. The active surface 111 of each of the chip 40 faces upwardly. In the present embodiment, an adhesive layer 41 is further disposed between a rear surface 42 of the chip and the first wiring layer 30'.

In the step (c), as shown in FIG. 9B, an encapsulant 600 is formed on the first wiring layer 30' to encapsulate the chips 40 and the metal pillar 50. In the present embodiment, an upper surface 610 of the encapsulant 600 is higher than a fourth top surface 51 of each of the metal pillars 50, and a third top surface 151 of the second dielectric layer 15 of the chips 40.

Figure 9C:
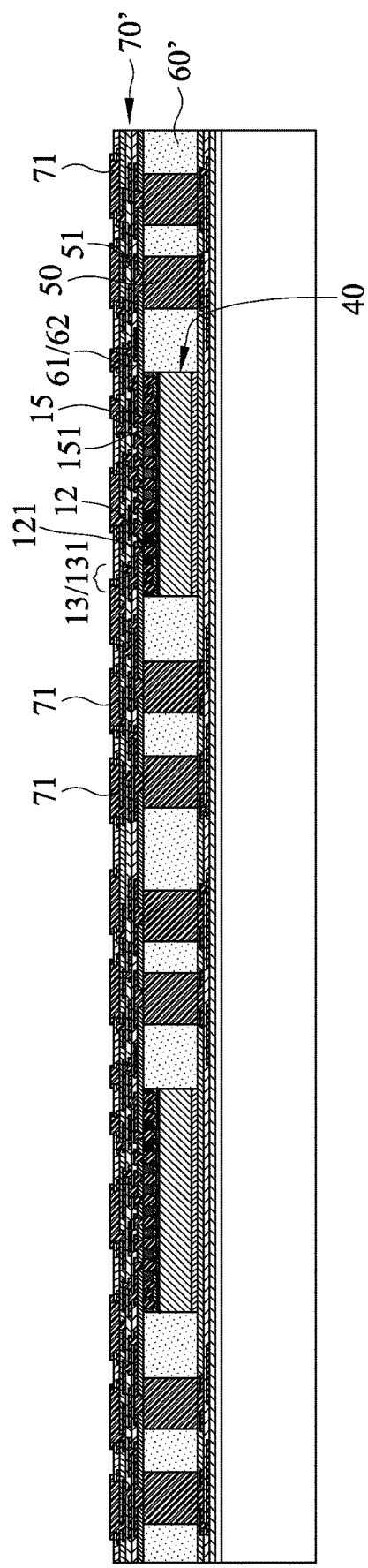

In the step (d), as shown in FIG. 9B, the upper surface 610 of the encapsulant 600 is ground. As shown in FIG. 9C, the upper surface 610 of the encapsulant 600 is ground until an upper surface 61 of an encapsulant 60' is flush with the first top surface 121 of the metal bumps 12 of the chips 40, the first plane pattern 131 of the at least one patterned bump 13 of the chips 40, and the third top surface 151 of the second dielectric layer 15 to form a plane 62.

In the step (e), as shown in FIG. 9C, a second wiring layer 70' is formed on the plane 62 to electrically connect to the metal bumps 12 of the chips 40 and the metal pillars 50. The second wiring layer 70' is electrically insulated with the patterned bumps 13. In the present embodiment, a plurality of metal pads 71 are formed on the second wiring layer 70' to electrically connect to a metal wire in the second wiring layer 70'.

Figure 9D:
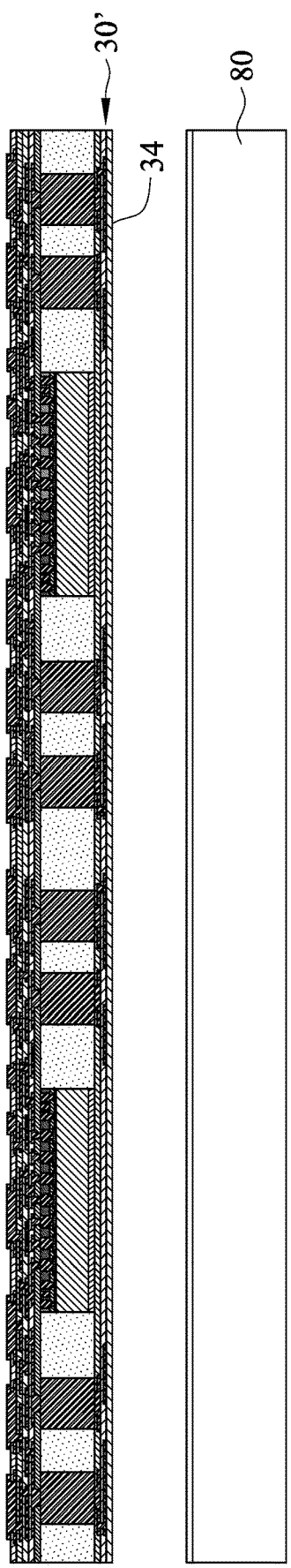
Figure 9E:
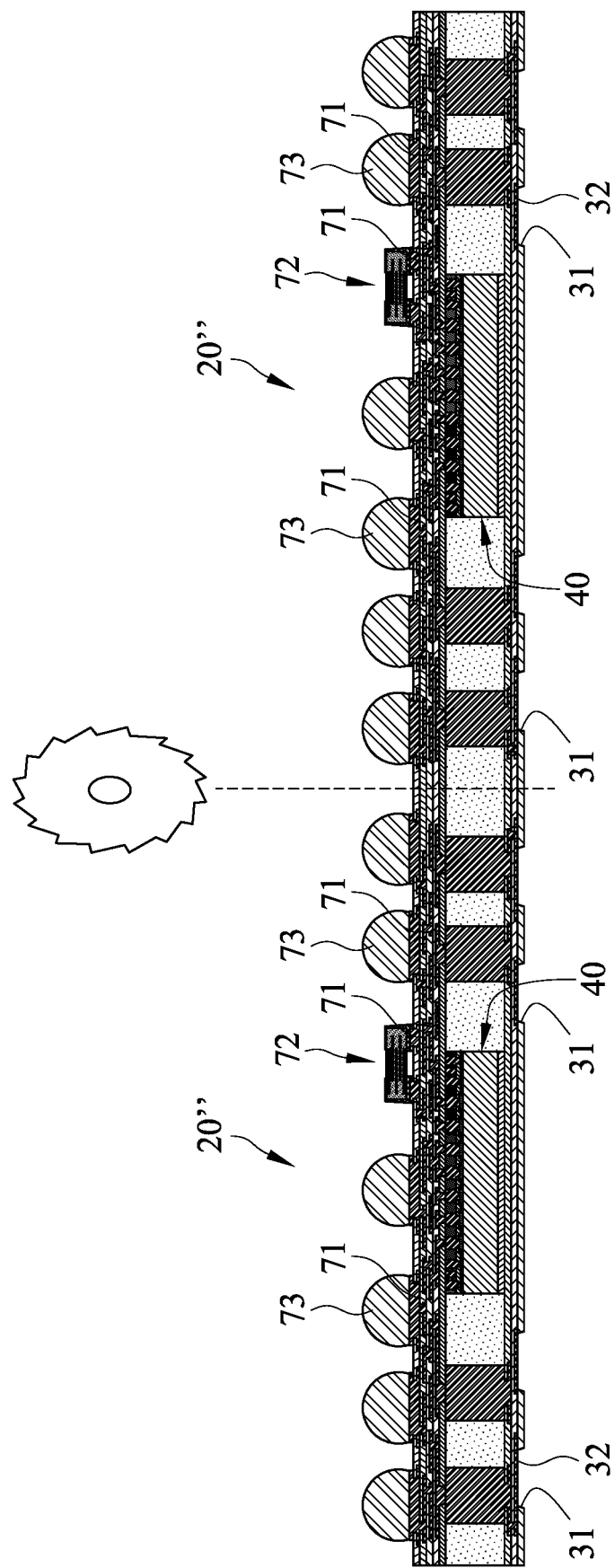

In the step (f), as shown in FIG. 9D, the carrier 80 is removed to expose a fourth bottom surface 34 of the first wiring layer 30'. In the present embodiment, as shown in FIG. 9E, a plurality of third openings 31 is formed on the fourth bottom surface 34 of the first wiring layer 30' to expose a part of a metal wire 32 in the first wiring layer 30'. In the present embodiment, as shown in FIG. 9E, a plurality of solder balls 73 is formed on the corresponding metal pads 71 of the second wiring layer 70'. A plurality of passive device 72 is disposed on and electrically connects to the corresponding metal pad 71. Each of the passive devices 72 is disposed of close to the corresponding chip 40 and surrounded by the solder balls 73.

In the step (g), as shown in FIG. 9E, a cutting step is processed to separate each of the semiconductor packages 20".

In conclusion, the encapsulant 600 encapsulates the chip 40 disposed on and the metal pillars formed on the first wiring layer 30' in the fabricating method of the semiconductor package in accordance with the present invention. The first plane pattern 131 of the patterned bumps 13 is flush with the first top surface 121 of the metal bumps 12 on the same chip 40. Therefore, in a grinding step of the encapsulant 600, detecting whether the first plane pattern 131 of the at least one patterned bump 13 is exposed from the upper surface 61 of the encapsulant 60 ensured that the first top surface 121 of each of the metal bumps 12 and is completely exposed and flush with the surface 51 of each of the metal pillar 50 to form the plane 62. A condition of insufficient depth of grinding or over-ground is avoided. The yield of the second wiring layer 70' formed on the plane 62 is ensured.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A chip structure, comprising:
   a chip body having an active surface and a plurality of pads, wherein the active surface includes:
      a pad area on which the plurality of pads formed on the pad area; and
      a pad-free area;
   a plurality of metal bumps respectively formed on the corresponding pad on the pad area, and a first top surface of the metal bumps higher than a first height; and
   at least one patterned bump formed on the pad-free area, wherein the at least one patterned bump comprises:
      a first plane pattern located at a first height; and
      a second plane pattern different from the first plane pattern and located at a second height, wherein the second height is smaller than the first height.

2. The chip structure as claimed in claim 1 further comprising:
   a first dielectric layer formed on the active surface having:
      a second top surface located at the second height;
      a plurality of first openings respectively corresponding to the pads and formed through the first dielectric layer, wherein the first openings respectively match the metal bumps; and
      at least one second opening corresponding to the pad-free area and formed through the first dielectric layer, wherein the at least one second opening matches the at least one patterned bump; and
   a second dielectric layer formed on the first dielectric layer, wherein
      the second dielectric layer encapsulates each of the metal bumps and the at least one patterned bump; and
      a third top surface of the second dielectric layer is higher than the first height.

3. The chip structure as claimed in claim 2, wherein a passivation layer is further formed between the active surface of the chip body and the first dielectric layer.

4. The chip structure as claimed in claim 3, wherein
   a first bottom surface of each of the metal bumps far from the first top surface is formed through the corresponding first opening and formed on the corresponding pad;
   each of the metal bumps is a solid metal pillar;
   each of the at least one patterned bump comprises:
      an outer hollow metal pillar having a second bottom surface far from the third top surface of the second dielectric layer, and the second bottom surface formed through the corresponding second opening and formed on the passivation layer; and
      an inner solid metal pillar having a third bottom surface far from the third top surface of the second dielectric layer, and the third bottom surface formed on the first dielectric layer and kept a gap with the outer hollow metal pillar, wherein
   a horizontal sectional view of the outer hollow metal pillar located at the second height constitutes the second plane pattern; and
   another horizontal sectional view of the outer hollow metal pillar located at the first height and the inner solid metal pillar located at the first height constitute the first plane pattern.

5. The chip structure as claimed in claim 4, wherein
   the first dielectric layer is transparent or translucent;
   the second dielectric layer is transparent or translucent; and
   a Young's modulus of the first dielectric layer is larger than a Young's modulus of the second dielectric layer.

6. The chip structure as claimed in claim 4, wherein
   a diameter of a part of each of the metal bumps located in the first opening is smaller than a diameter of a part of each of the metal bumps located in the second dielectric layer; or a diameter of a part of each of the outer hollow metal pillars located in the second opening is smaller than a diameter of a part of each of the outer hollow metal pillars located in the second dielectric layer.

7. The chip structure as claimed in claim 6, wherein
the outer hollow metal pillar is a hollow cylinder or a hollow corner cylinder; and
the inner solid metal pillar is a solid cylinder or a solid corner cylinder.

8. A semiconductor package with grind indication bump, comprising:
a first wiring layer;
at least one chip as a chip structure claimed in claim 1 disposed on the first wiring layer, and the active surface facing upwardly;
a plurality of metal pillars formed on and electrically connecting to the first wiring layer having a third top surface;
an encapsulant formed on the first wiring layer and encapsulating the at least one chip and the metal pillars, wherein an upper surface of the encapsulant is flush with the first top surface of each of the metal bumps of the at least one chip, one of the plane patterns of the at least one patterned bump, and the third top surface of each of the metal pillars to form a plane; and
a second wiring layer formed on the plane to electrically connect to the metal bumps of the at least one chip structure and the metal pillars and electrically insulated with the patterned bumps.

9. The semiconductor package as claimed in claim 8, wherein
the first wiring layer has a plurality of third openings and a metal wire;
a part of a metal wire of the first wiring layer is exposed from the third openings; and
the second wiring layer further has a plurality of metal pads formed on and electrically connecting to the second wiring layer.

10. The semiconductor package as claimed in claim 9 further having:
at least one passive device electrically connecting to the corresponding metal pads of the second wiring layer and disposed of close to the corresponding chip; and
a plurality of solder balls formed on the corresponding metal pads of the second wiring layer and surrounding the corresponding passive device.

11. The semiconductor package as claimed in claim 10, wherein
a warpage control layer is further formed on the first wiring layer;
the third openings of the first wiring layer are further formed through the warpage control layer; and
a slope of a peripheral wall of a part of each of the third openings located at the first wiring layer is the same as a slope of a peripheral wall of a part of each of the third openings located at the warpage control layer.

12. The semiconductor package as claimed in claim 11, wherein
the at least one chip further has an adhesive layer and a rear surface; and
the adhesive layer is disposed between the rear surface of the at least one chip and the first wiring layer.

13. The semiconductor package as claimed in claim 12, wherein
the first wiring layer is a substrate or a redistribution layer; and
the second wiring layer is a substrate or a redistribution layer.

14. A fabricating method of semiconductor package, comprising steps of:
(a) providing a carrier and forming a first wiring layer on the carrier;
(b) disposing a plurality of chips as the chip structure claimed in claim 1 and forming a plurality of metal pillars on the first wiring layer, wherein the active surface of each of the chip body faces upwardly, each of the metal pillars has a third top surface, and the metal pillars electrically connect to the first wiring layer;
(c) forming an encapsulant on the first wiring layer to encapsulate the metal pillars and the chips;
(d) grinding an upper surface of the encapsulant until the upper surface of the encapsulant to be flush with the first top surface of each of the metal bumps of the chips, the first plane pattern of the at least one patterned bump of the chips, and the third top surface of each of the metal pillars to form a plane;
(e) forming a second wiring layer on the plane of the encapsulant to electrically connect to the metal pillars and the metal bumps of the chips, and the second wiring layer electrically insulated with the patterned bumps of the chips;
(f) removing the carrier to expose a fourth bottom surface of the first wiring layer; and
(g) processing a cutting step to separate each semiconductor structure.

15. The fabricating method as claimed in claim 14, wherein
in the step (e), a plurality of metal pads is further formed on the second wiring layer and electrically connects to a metal wire in the second wiring layer; and
in the step (f), a plurality of third openings is further formed on the fourth bottom surface of the first wiring layer to expose a metal wire in the first wiring layer.

16. The fabricating method as claimed in claim 15, wherein
in the step (f), a plurality of solder balls is formed on the corresponding metal pad of the second wiring layer, and a plurality of passive devices electrically connect to the corresponding metal pads on the second wiring layer; and
each of the passive devices is disposed of close to the corresponding chip and surrounded by the corresponding solder balls.

17. The fabricating method as claimed in claim 16, wherein in the step (b), an adhesive layer is further disposed between a rear surface of each of the chips and the first wiring layer.

18. The fabricating method as claimed in claim 17, wherein
the first wiring layer is a substrate or a redistribution layer; and
the second wiring layer is a substrate or a redistribution layer.

* * * * *